United States Patent
Dierberger

(10) Patent No.: US 10,287,899 B2
(45) Date of Patent: May 14, 2019

(54) CERAMIC ATTACHMENT CONFIGURATION AND METHOD FOR MANUFACTURING SAME

(71) Applicant: United Technologies Corporation, Farmington, CT (US)

(72) Inventor: James A. Dierberger, Hebron, CT (US)

(73) Assignee: United Technologies Corporation, Farmington, CT (US)

( * ) Notice: Subject to any disclaimer, the term of this patent is extended or adjusted under 35 U.S.C. 154(b) by 470 days.

(21) Appl. No.: 15/028,777

(22) PCT Filed: Oct. 10, 2014

(86) PCT No.: PCT/US2014/060065
§ 371 (c)(1),
(2) Date: Apr. 12, 2016

(87) PCT Pub. No.: WO2015/061060
PCT Pub. Date: Apr. 30, 2015

(65) Prior Publication Data
US 2016/0251972 A1     Sep. 1, 2016

Related U.S. Application Data

(60) Provisional application No. 61/893,545, filed on Oct. 21, 2013.

(51) Int. Cl.
*F01D 5/28*     (2006.01)
*F01D 5/30*     (2006.01)
(Continued)

(52) U.S. Cl.
CPC .......... *F01D 5/3007* (2013.01); *C04B 41/009* (2013.01); *C04B 41/4523* (2013.01);
(Continued)

(58) Field of Classification Search
CPC ........ F01D 5/288; F01D 5/284; F01D 5/3007; F01D 5/3092; C23C 4/06; C23C 14/083;
(Continued)

(56) References Cited

U.S. PATENT DOCUMENTS 4,961,459 A * 10/1990 Blazek ...................... B22C 9/04
                                                              164/10
6,132,175 A * 10/2000 Cai ......................... F01D 5/284
                                                              403/29
(Continued)

FOREIGN PATENT DOCUMENTS

EP     0266299     5/1988
EP     2468434     6/2012
(Continued)

OTHER PUBLICATIONS

Supplementary European Search Report for European Patent Application No. 14856302.6 dated Apr. 21, 2017.
(Continued)

*Primary Examiner* — Igor Kershteyn
(74) *Attorney, Agent, or Firm* — Carlson, Gaskey & Olds, P.C.

(57) ABSTRACT

A component assembly includes a support structure, a ceramic substrate mounted to the support, and a foam-like coating adhered to one of the support structure and the ceramic substrate. The foam-like coating engages the other of the support structure and the ceramic substrate.

18 Claims, 1 Drawing Sheet

(51) Int. Cl.
| | | |
|---|---|---|
| *C23C 4/06* | (2016.01) | |
| *C23C 30/00* | (2006.01) | |
| *C23C 4/11* | (2016.01) | |
| *C23C 4/129* | (2016.01) | |
| *C23C 4/134* | (2016.01) | |
| *C04B 41/00* | (2006.01) | |
| *C04B 41/45* | (2006.01) | |
| *C04B 41/50* | (2006.01) | |
| *C04B 41/87* | (2006.01) | |
| *C23C 4/10* | (2016.01) | |
| *C23C 14/06* | (2006.01) | |
| *C23C 14/08* | (2006.01) | |
| *C23C 14/30* | (2006.01) | |
| *C23C 16/32* | (2006.01) | |
| *C23C 16/34* | (2006.01) | |
| *C23C 16/40* | (2006.01) | |

(52) U.S. Cl.
CPC ...... *C04B 41/4527* (2013.01); *C04B 41/4529* (2013.01); *C04B 41/4531* (2013.01); *C04B 41/4582* (2013.01); *C04B 41/5025* (2013.01); *C04B 41/87* (2013.01); *C23C 4/06* (2013.01); *C23C 4/10* (2013.01); *C23C 4/11* (2016.01); *C23C 4/129* (2016.01); *C23C 4/134* (2016.01); *C23C 14/0635* (2013.01); *C23C 14/0652* (2013.01); *C23C 14/083* (2013.01); *C23C 14/30* (2013.01); *C23C 16/325* (2013.01); *C23C 16/345* (2013.01); *C23C 16/405* (2013.01); *C23C 30/00* (2013.01); *F01D 5/284* (2013.01); *F01D 5/288* (2013.01); *F01D 5/3092* (2013.01); *F05D 2220/32* (2013.01); *F05D 2230/311* (2013.01); *F05D 2230/312* (2013.01); *F05D 2230/313* (2013.01); *F05D 2230/314* (2013.01); *F05D 2240/24* (2013.01); *F05D 2300/20* (2013.01); *F05D 2300/514* (2013.01); *F05D 2300/6033* (2013.01); *F05D 2300/612* (2013.01)

(58) Field of Classification Search
CPC . C23C 14/0652; C23C 14/0653; C23C 14/30; C23C 30/00; C23C 30/16; C23C 30/325; C23C 30/345; C23C 30/405; C04B 41/009; C04B 41/4523; C04B 41/4527; C04B 41/4529; C04B 41/4531; C04B 41/4582; C04B 41/5025; C04B 41/87; F05D 2220/32; F05D 2230/311; F05D 2230/312; F05D 2230/313; F05D 2230/314; F05D 2240/24; F05D 2300/20; F05D 2300/514; F05D 2300/612; F05D 2300/6033

See application file for complete search history.

(56) References Cited

U.S. PATENT DOCUMENTS

| | | | |
|---|---|---|---|
| 6,409,473 B1* | 6/2002 | Chen | F01D 5/225 |
| | | | 415/191 |
| 7,875,370 B2 | 1/2011 | Schlichting et al. | |
| 7,968,031 B2* | 6/2011 | Carper | C04B 35/565 |
| | | | 264/251 |
| 7,972,113 B1* | 7/2011 | Davies | F01D 5/025 |
| | | | 416/214 A |
| 8,251,651 B2* | 8/2012 | Propheter-Hinckley | |
| | | | F01D 5/284 |
| | | | 415/200 |
| 2005/0069411 A1 | 3/2005 | Bast et al. | |
| 2006/0153685 A1 | 7/2006 | Bolms et al. | |
| 2007/0122266 A1* | 5/2007 | Cairo | F01D 5/284 |
| | | | 415/134 |
| 2009/0060747 A1* | 3/2009 | Strock | F01D 11/125 |
| | | | 416/241 B |
| 2010/0098923 A1 | 4/2010 | Freling et al. | |
| 2011/0143043 A1 | 6/2011 | Zajchowski et al. | |
| 2012/0163979 A1* | 6/2012 | Darkins, Jr. | B22D 19/0054 |
| | | | 416/223 R |
| 2012/0171039 A1 | 7/2012 | Huang et al. | |
| 2013/0247586 A1 | 9/2013 | Luczak | |
| 2014/0212292 A1* | 7/2014 | Xu | F01D 5/30 |
| | | | 416/193 A |

FOREIGN PATENT DOCUMENTS

| | | |
|---|---|---|
| JP | 08093403 | 4/1996 |
| JP | 08326503 | 12/1996 |
| WO | 2008063697 | 5/2008 |
| WO | 2013126490 | 8/2013 |

OTHER PUBLICATIONS

The International Preliminary Report on Patentability for PCT Application No. PCT/US2014/0600065, dated May 6, 2016.
International Search Report and Written Opinion for PCT Application No. PCT/US2014/060065, dated Jan. 28, 2015.

* cited by examiner

CERAMIC ATTACHMENT CONFIGURATION AND METHOD FOR MANUFACTURING SAME

CROSS-REFERENCE TO RELATED APPLICATIONS

This application claims priority to U.S. Provisional Application No. 61/893,545, which was filed on Oct. 21, 2013 and is incorporated herein by reference.

BACKGROUND

This disclosure relates to a ceramic attachment configuration and a method for manufacturing the same. The example the ceramic attachment configuration relates to a component assembly for a gas turbine engine, such as a rotor and blade assembly.

There is much interest in the use of ceramic matrix composite materials and other ceramics for components in the hot section of the gas turbine engine. Ceramics reduce the weight of the hot section and contribute to engine efficiency by increasing the temperature at which the gas turbine engine may operate.

In one prior art arrangement, a ceramic matrix composite blade is retained within a slot of a metallic rotor. An interface between the blade root and the rotor slot is carefully controlled to transfer loads between the blade and rotor without creating undue stress. Nonetheless, undesired loading may occur at the interface.

SUMMARY

In one exemplary embodiment, a component assembly includes a support structure, a ceramic substrate mounted to the support, and a foam-like coating adhered to one of the support structure and the ceramic substrate. The foam-like coating engages the other of the support structure and the ceramic substrate.

In a further embodiment of the above, the support structure is metallic.

In a further embodiment of any of the above, the foam-like coating is a porous metal.

In a further embodiment of any of the above, the porous metal is at least one of copper and aluminum.

In a further embodiment of any of the above, the foam-like coating is one of a ceramic matrix composite and a monolithic ceramic.

In a further embodiment of any of the above, the foam-like coating is at least one of a carbide and an oxide.

In a further embodiment of any of the above, the foam-like coating is zirconia.

In a further embodiment of any of the above, the foam-like coating is adhered to the ceramic substrate.

In a further embodiment of any of the above, the foam-like coating has filaments intersecting one another to provide voids creating a flexible layer.

In a further embodiment of any of the above, the foam-like coating has a thickness of up to 5 mils (127 micrometers).

In a further embodiment of any of the above, the support structure is a rotor having a slot and comprising a blade including a root that provides the ceramic substrate. The root is received in the slot.

In a further embodiment of any of the above, the foam-like coating is adhered to the root.

In a further embodiment of any of the above, the foam-like coating is adhered to the slot.

In a further embodiment of any of the above, the foam-like coating is configured to transfer a force from a high point on the support to the ceramic substrate without cracking a surface of the ceramic substrate with which the foam-like coating is in engagement.

In a further embodiment of any of the above, the foam-like coating is configured to flex in response to the force.

In another exemplary embodiment, a method of manufacturing a component assembly includes the steps of depositing ceramic onto a rigid ceramic substrate to produce a flexible foam-like coating having a porosity of less than 30%

In a further embodiment of the above, the depositing step includes one of chemical vapor deposition, electron beam physical vapor deposition, flame spraying and plasma spraying.

In a further embodiment of any of the above, the foam-like coating includes filaments that intersect one another to provide voids that create a flexible layer that has a thickness of up to 5 mils (127 micrometers).

In a further embodiment of any of the above, a blade includes a root that provides the ceramic substrate and includes the step of installing the root into a rotor slot. The foam-like coating is configured to transfer a force from a high point on the rotor slot to the ceramic substrate by flexing without cracking a surface of the root.

In a further embodiment of any of the above, the ceramic substrate is one of a ceramic matrix composite and a monolithic ceramic.

BRIEF DESCRIPTION OF THE DRAWINGS

The disclosure can be further understood by reference to the following detailed description when considered in connection with the accompanying drawings wherein.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
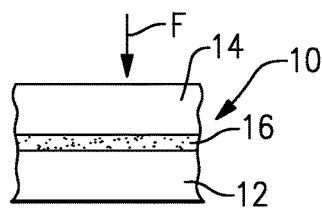
FIG. 1 is a 1 schematic view of a component assembly.

Component assembly 10 is schematically shown in FIG. 1. The assembly 10 includes a ceramic substrate 12 supported relative a support structure 14. A foam-like coating 16 is arranged between the ceramic substrate 12 and support structure 14 to absorb a load at the interface transferred between the ceramic substrate 12 and the support structure 14. The foam-like coating 16 is adhered to one of the ceramic substrate 12 and/or support structure 14 to act as a gasket between these components. In one example, the foam-like coating is a ceramic, and in another example, a metal. The foam-like coating 16 forms a thin, compliant zone that eliminates point contact between the ceramic substrate 12 and support structure 14 to prevent damage, such as cracking, to the ceramic substrate 12.

Figure 2:
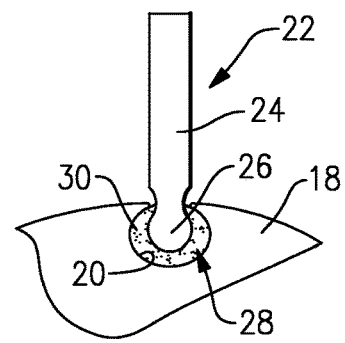
FIG. 2 is a schematic view of a ceramic blade arranged within a rotor slot.

One example application of the component assembly 10, a turbine stage, is illustrated in FIG. 2. A rotor 18 includes a slot 20 that receives a blade 22. The blade 22 includes an airfoil 24 and a root 26, which is received in the slot 20. In one example, the rotor 18 is metallic material, such as a nickel alloy. The blade 22 is a ceramic material, such as a ceramic matrix composite (CMC) and/or a monolithic ceramic. For a root constructed from a ceramic-based material, the ceramic may become cracked if there is any point contact or irregularities at the interface between the rotor 18 and root 26.

Figure 3A:
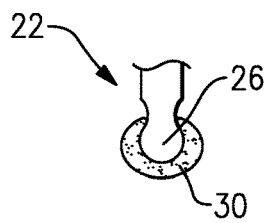
FIG. 3A is a schematic view of a root of a ceramic blade having a ceramic coating adhered thereto.
Figure 3B:
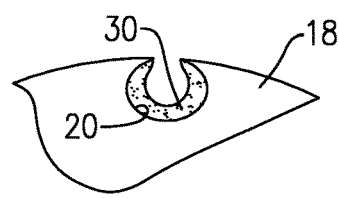
FIG. 3B is a schematic view of a rotor slot having a ceramic coating adhered thereto.

A slight clearance 28 is provided between the rotor 18 and root 26 in the area of the slot 20. A foam-like coating 30 is provided to take up at least some of the clearance 28. In the example illustrated in FIG. 3A, the foam-like coating 30 is adhered to the root 26. In the example illustrated in FIG. 3B, the foam-like coating 30 is adhered to the rotor 18. In another example, the foam-like coating is adhered to both the root and the rotor.

Figure 4:
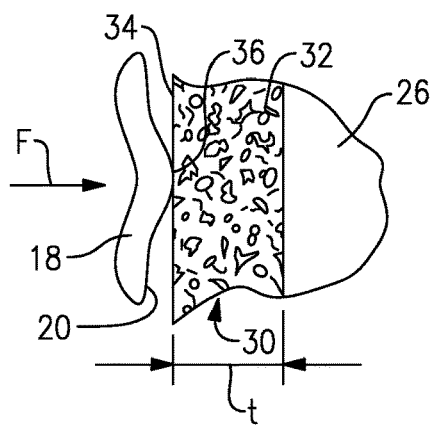
FIG. 4 is an enlarged schematic view of a ceramic coated substrate subjected to a point load.
Figure 5:
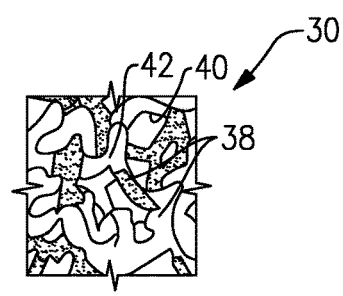
FIG. 5 is an enlarged schematic view of the ceramic coating.

Referring to FIG. 4, the foam-like coating 30, which may be the same material as the ceramic substrate, is adhered to a surface 32 of the root 26 to provide a load transfer surface 34. The foam-like coating 30 may have a thickness of up to 5 mils (127 micrometers), for example. The foam-like coating 30 provides a structure having ceramic filaments 38 joined to one another at intersections 42 and providing voids 40, as shown in FIG. 5. The filaments 38 and voids 40 creating a flexible layer as compared to the rigid ceramic substrate 12. Similarly, in another example, a foamed metal creates interconnected metal filaments spaced apart by voids.

Force F from point contact, provided by irregularity or high point 36, is eliminated through local filament bending and compression of the foam-like coating 30. In this manner, the foam-like coating 30 is configured to transfer the force F from a high point on the support structure 18 to the root 26 without cracking the ceramic substrate with which the ceramic coating is in engagement. In one example, the foam-like coating 30 has a porosity of up to 30%, and in another example, a porosity of up to 20%. A porosity in the range of 5-10% may be sufficient to provide adequate flexible to absorb the force F.

Figure 6:
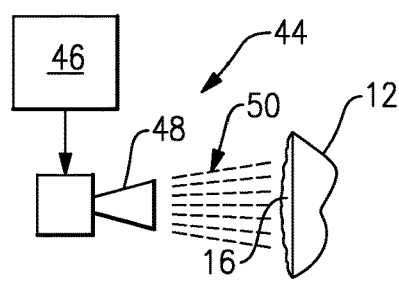
FIG. 6 is a schematic view of a system used to manufacture the component assembly.

Referring to FIG. 6, an example system 44 includes a material feeder 46 having the ceramic coating in the form of a powder, for example. In one example, the ceramic powder is zirconia-based, SiC and/or SiN. The ceramic coating is fed to a nozzle 48, which sprays a plasma 50 onto the ceramic substrate 12 to provide the foam-like coating 16. In this manner, a ceramic is deposited onto a rigid ceramic substrate to provide a flexible ceramic coating having a foam-like structure of three-dimensional interlocking ceramic filaments. The depositing may be performed by at least one of chemical or physical vapor deposition (e.g. electron beam), flame spraying, and/or plasma spraying.

Alternatively, a molten metal, such as copper, aluminum, other metals, or alloys thereof, can be applied to the substrate using a foaming agent, which creates a porous metal providing the foam-like coating.

It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a worker of ordinary skill in this art would recognize that certain modifications would come within the scope of the claims. For that reason, the following claims should be studied to determine their true scope and content.

What is claimed is:

1. A component assembly comprising:
   a support structure, wherein the support structure is a rotor having a slot;
   a ceramic substrate mounted to the support;
   a blade including a root that provides the ceramic substrate, the root received in the slot; and
   a foam-like coating having a porosity of less than 30% that is adhered to one of the support structure and the ceramic substrate, and the foam-like coating engaging the other of the support structure and the ceramic substrate.

2. The assembly according to claim 1, wherein the support structure is metallic.

3. The assembly according to claim 1, wherein the foam-like coating is a porous metal.

4. The assembly according to claim 3, wherein the porous metal is at least one of copper and aluminum.

5. The assembly according to claim 1, wherein the foam-like coating is one of a ceramic matrix composite and a monolithic ceramic.

6. The assembly according to claim 5, wherein the foam-like coating is at least one of a carbide and an oxide.

7. The assembly according to claim 6, wherein the foam-like coating is zirconia.

8. The assembly according to claim 1, wherein the foam-like coating is adhered to the ceramic substrate.

9. The assembly according to claim 1, wherein the foam-like coating has filaments intersecting one another to provide voids creating a flexible layer.

10. The assembly according to claim 9, wherein the foam-like coating has a thickness of up to 5 mils.

11. The assembly according to claim 1, wherein the foam-like coating is adhered to the root.

12. The assembly according to claim 1, wherein the foam-like coating is adhered to the slot.

13. The assembly according to claim 1, wherein the foam-like coating is configured to transfer a force from a high point on the support to the ceramic substrate without cracking a surface of the ceramic substrate with which the foam-like coating is in engagement.

14. The assembly according to claim 13, wherein the foam-like coating is configured to flex in response to the force.

15. A method of manufacturing a component assembly comprising a blade including a root that provides the ceramic substrate, the method comprising the steps of:
   depositing ceramic onto a rigid ceramic substrate to produce a flexible foam-like coating having a porosity of less than 30%; and installing the root into a rotor slot, wherein the foam-like coating is configured to transfer a force from a high point on the rotor slot to the ceramic substrate by flexing without cracking a surface of the root.

16. The method according to claim 15, wherein the depositing step includes one of chemical vapor deposition, electron beam physical vapor deposition, flame spraying and plasma spraying.

17. The method according to claim 15, wherein the foam-like coating includes filaments intersecting one another to provide voids creating a flexible layer having a thickness of up to 5 mils.

18. The method according to claim 15, wherein the ceramic substrate is one of a ceramic matrix composite and a monolithic ceramic.

* * * * *